(12) United States Patent
Chen et al.

(10) Patent No.: US 10,845,927 B1
(45) Date of Patent: Nov. 24, 2020

(54) TOUCH PANEL

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Po-Lin Chen, Shenzhen (CN); Hsuan-Man Chang, Shenzhen (CN); Min-Hui Yin, Shenzhen (CN); Chu-Jung Lin, Shenzhen (CN); Mei-Hua Chou, Shenzhen (CN)

(73) Assignees: Interface Technology (Chengdu) Co., Ltd., Chengdu (CN); Interface Optoelectronics (Shenzhen) Co., Ltd., Shenzhen (CN); General Interface Solution Limited, Miaoli County (TW)

( * ) Notice: Subject to any disclaimer, the term of this patent is extended or adjusted under 35 U.S.C. 154(b) by 0 days.

(21) Appl. No.: 16/430,707

(22) Filed: Jun. 4, 2019

(30) Foreign Application Priority Data

May 20, 2019 (CN) .......................... 2019 1 0418624

(51) Int. Cl.
*G06F 3/044* (2006.01)
*H05K 1/11* (2006.01)

(52) U.S. Cl.
CPC ............. *G06F 3/044* (2013.01); *H05K 1/118* (2013.01); *H05K 2201/10151* (2013.01)

(58) Field of Classification Search
CPC ................... G06F 3/044; H05K 1/118; H05K 2201/10151
See application file for complete search history.

(56) References Cited

U.S. PATENT DOCUMENTS

| 4,313,995 | A | * | 2/1982 | Delgadillo | ............. | H05K 3/041 |
|---|---|---|---|---|---|---|
| | | | | | | 156/253 |
| 4,731,282 | A | * | 3/1988 | Tsukagoshi | ............. | H01R 4/04 |
| | | | | | | 428/220 |
| 5,466,892 | A | * | 11/1995 | Howard | ............... | H05K 1/0239 |
| | | | | | | 174/250 |
| 5,484,648 | A | * | 1/1996 | Odashima | ................ | H01R 4/04 |
| | | | | | | 428/209 |
| 9,557,847 | B2 | * | 1/2017 | Chen | ................... | G06F 3/04886 |
| 9,587,797 | B2 | * | 3/2017 | Park | ..................... | G02B 6/0041 |
| 9,997,487 | B2 | * | 6/2018 | Heo | ....................... | H05K 1/118 |
| 10,014,449 | B1 | * | 7/2018 | Morikawa | ............. | H01L 33/504 |
| 10,134,859 | B1 | * | 11/2018 | Bi | ....................... | H01L 29/6656 |

(Continued)

*Primary Examiner* — Grant Sitta
(74) *Attorney, Agent, or Firm* — Rosenberg, Klein & Lee

(57) ABSTRACT

A touch panel includes a touch sensing layer, a flexible circuit board and an anisotropic conductive film. The touch sensing layer includes sensing pads and a reserved room, and the reserved room is arranged outside the sensing pads. The flexible circuit board includes conductive pads, the outermost conductive pad is provided with a virtual pattern, and the position of the virtual pattern corresponds to the position of the reserved room. The anisotropic conductive film is arranged between the touch sensing layer and the flexible circuit board, and the sensing pads are respectively electrically connected to the conductive pads through the anisotropic conductive film.

10 Claims, 5 Drawing Sheets

(56) References Cited

U.S. PATENT DOCUMENTS

| | | | |
|---|---|---|---|
| 10,663,795 B1* | 5/2020 | Chen | G02F 1/133603 |
| 2010/0085258 A1* | 4/2010 | Teshima | H01Q 9/42 |
| | | | 343/700 MS |
| 2010/0231530 A1* | 9/2010 | Lin | G06F 3/044 |
| | | | 345/173 |
| 2011/0242796 A1* | 10/2011 | Yang | C09J 133/08 |
| | | | 362/97.1 |
| 2012/0032910 A1* | 2/2012 | Kim, II | G06F 3/03547 |
| | | | 345/174 |
| 2013/0213788 A1* | 8/2013 | Tanabe | G06F 3/0445 |
| | | | 200/600 |
| 2013/0306943 A1* | 11/2013 | Kato | C09J 125/18 |
| | | | 257/40 |
| 2014/0017444 A1* | 1/2014 | Shimizu | B82Y 30/00 |
| | | | 428/131 |
| 2014/0071358 A1* | 3/2014 | Kuriki | G06F 3/044 |
| | | | 349/12 |
| 2014/0362036 A1* | 12/2014 | Mo | G06F 3/044 |
| | | | 345/174 |
| 2015/0022741 A1* | 1/2015 | Nii | G06F 1/1643 |
| | | | 349/12 |
| 2015/0295332 A1* | 10/2015 | Shedletsky | H05K 3/361 |
| | | | 439/83 |
| 2016/0356930 A1* | 12/2016 | Li | G03F 7/40 |
| 2016/0362586 A1* | 12/2016 | Kiyoto | C09J 9/02 |
| 2016/0370901 A1* | 12/2016 | Sutou | G06F 3/044 |
| 2018/0020550 A1* | 1/2018 | Jang | H05K 1/111 |
| 2018/0197484 A1* | 7/2018 | Moon | G09G 3/3225 |
| 2019/0223284 A1* | 7/2019 | Kalio | H05K 3/361 |
| 2019/0227650 A1* | 7/2019 | Fang | G06F 3/044 |
| 2019/0271911 A1* | 9/2019 | Wu | G03F 7/30 |
| 2019/0295910 A1* | 9/2019 | Horiuchi | H01L 31/024 |
| 2019/0369787 A1* | 12/2019 | Park | G06F 3/044 |
| 2020/0012141 A1* | 1/2020 | Kim | G02F 1/13452 |
| 2020/0187359 A1* | 6/2020 | Zheng | H05K 1/189 |

* cited by examiner

TOUCH PANEL

This application claims priority for China patent application no. 201910418624.8 filed on May 20, 2019, the content of which is incorporated by reference in its entirely.

BACKGROUND OF THE INVENTION

Field of the Invention

The present invention relates to a touch panel, particularly to a touch panel for reducing the area of a flexible circuit board.

Description of the Related Art

In recent years, indium tin oxide (ITO) films develop and applied materials innovate. With the popularity of smart phones and tablet computers, the post-PC era begins to foreshadow the rise of the touch panel industry. The touch technology is widely applied to various multimedia electronic products, such as mobile devices, smart phones, E-books, or tablet computers. The touch devices are used as input devices to replace keyboards or mice. In order to improve the convenience and the operating intuitiveness, the touch technology has been applied to the popular human-machine interfaces and multimedia interaction.

With the improvement and the development of touch devices, the present touch devices trend to slimness, compactness, light weight, and large area. Besides, the very important problem is how to reduce the fabrication cost of touch devices. For example, many researchers research smart phones. Refer to FIG. 1. FIG. 1 is a bottom view of a touch panel in the conventional technology. As illustrated in FIG. 1, a flexible circuit board 10 has a plurality of conductive traces 12. In general, a blank room is reserved among the conductive traces 12 and a virtual lead 14 is arranged in the blank room. The virtual lead 14 is arranged between the grounding trace and the sensing trace. The flexible circuit board 10 is combined with a sensing layer 16 to form an electrical connection through an anisotropic conductive film 18. The sensing layer 16 is provided with a reserved room corresponding to the virtual lead 14. The rupture of conductive particles of the anisotropic conductive film 18 is observed through the reserved room when the anisotropic conductive film 18 is combined with the flexible circuit board 10 and the sensing layer 16. The flexible circuit board 10 has a reserved area to design the virtual lead 14, which increases the total area and the cost of the flexible circuit board 10. Thus, how to reduce the area and the fabrication cost of the flexible circuit board is a problem to be solved.

To overcome the abovementioned problems, the present invention provides a touch panel, so as to solve the aforementioned problems of the prior art.

SUMMARY OF THE INVENTION

The primary objective of the present invention is to provide a touch panel, which reduces the area of the conventional virtual lead and designs a virtual pattern outside all pads and a reserved room corresponding to the virtual pattern. The rupture of conductive particles is directly observed through the reserved room. Using the virtual pattern and the reserved room, the area and the fabrication cost of a flexible circuit board are reduced.

The secondary objective of the present invention is to provide a touch panel, which designs a virtual pattern outside all pads to reduce the fabrication cost without modifying the existing fabrication process, equipment, and materials.

To achieve the abovementioned objectives, the present invention provides a touch panel, which comprises a touch sensing layer, a flexible circuit board, and an anisotropic conductive film. The touch sensing layer comprises sensing pads and a reserved room, and the reserved room is arranged outside the sensing pads. The flexible circuit board comprises conductive pads, the outermost conductive pad is provided with a virtual pattern, and the position of the virtual pattern corresponds to the position of the reserved room. The anisotropic conductive film is arranged between the touch sensing layer and the flexible circuit board, and the sensing pads are respectively electrically connected to the conductive pads through the anisotropic conductive film. The rupture of conductive particles of the anisotropic conductive film is directly observed through the reserved room when the anisotropic conductive film is combined with the touch sensing layer and the flexible circuit board.

In an embodiment of the present invention, the virtual pattern is connected to the outermost conductive pad. Alternatively, a gap exists between the virtual pad and the outermost conductive pad. In other words, the virtual pad is independent from the outermost conductive pad.

In an embodiment of the present invention, the outermost sensing pad is provided with a first aligned portion, the outermost conductive pad is provided with a second aligned portion, and the first aligned portion is correspondingly connected to the second aligned portion to improve the precision in fabrication when the touch sensing layer is combined with the flexible circuit board through the anisotropic conductive film.

In an embodiment of the present invention, the anisotropic conductive film comprises a plurality of conductive particles and an area of the virtual pattern is larger than an area of one of the plurality of conductive particles. The area of the virtual pattern is larger than 0.013 mm$^2$.

In an embodiment of the present invention, the anisotropic conductive film has a thickness of 45~55 μm.

In an embodiment of the present invention, the area of the reserved room is larger than the area of the virtual pattern, such that the rupture of the plurality of conductive particles is directly observed.

In an embodiment of the present invention, the sensing pads further comprise at least one first grounding pad and touch electrodes, the at least one first grounding pad is arranged outside the touch electrodes, and the at least one first grounding pad is arranged between the reserved room and the touch electrode. The conductive pads further comprise at least one second grounding pad and touch pads, the at least one second grounding pad is arranged outside the touch pads, and the at least one second grounding pad is arranged between the virtual pattern and the touch pad. The position of the first grounding pad corresponds to the position of the second grounding pad. The positions of the touch electrodes respectively correspond to the positions of the touch pads. When the touch sensing layer is combined with the flexible circuit board through the anisotropic conductive film, the first grounding pad corresponds to the second grounding pad to form an electrical connection, and the touch electrodes correspond to the touch pads to form an electrical connection.

Below, the embodiments are described in detail in cooperation with the drawings to make easily understood the technical contents, characteristics and accomplishments of the present invention.

DETAILED DESCRIPTION OF THE INVENTION

Figure 1:
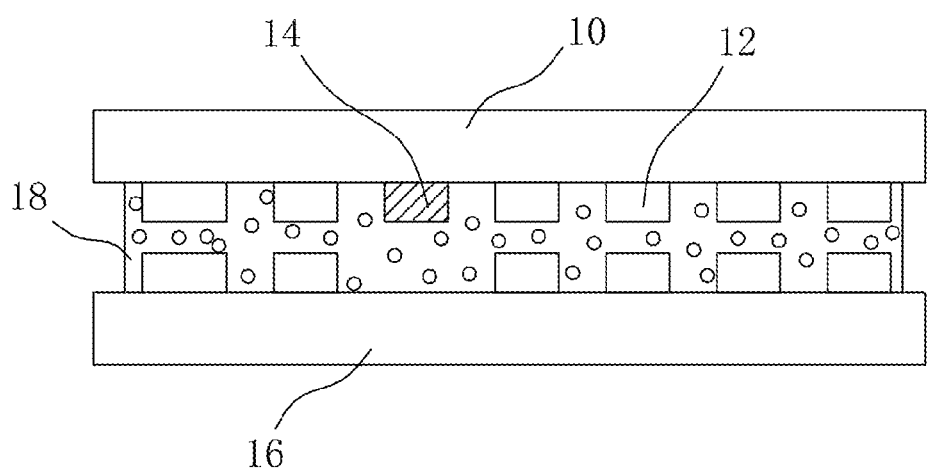
FIG. 1 is a bottom view of a touch panel in the conventional technology.

The inventor of the present invention researches for many years to invent a touch panel, which breakthroughs the bottleneck for the area of the existing flexible circuit board. Below, the embodiments are described in detail in cooperation with the drawings to make easily understood the technical contents, characteristics and accomplishments of the present invention. The embodiments described above are only to exemplify the present invention but not to limit the scope of the present invention. Wherever possible, the same reference numbers are used in the drawings and the description to refer to the same or like parts. In the drawings, the shape and thickness may be exaggerated for clarity and convenience.

Figure 2:
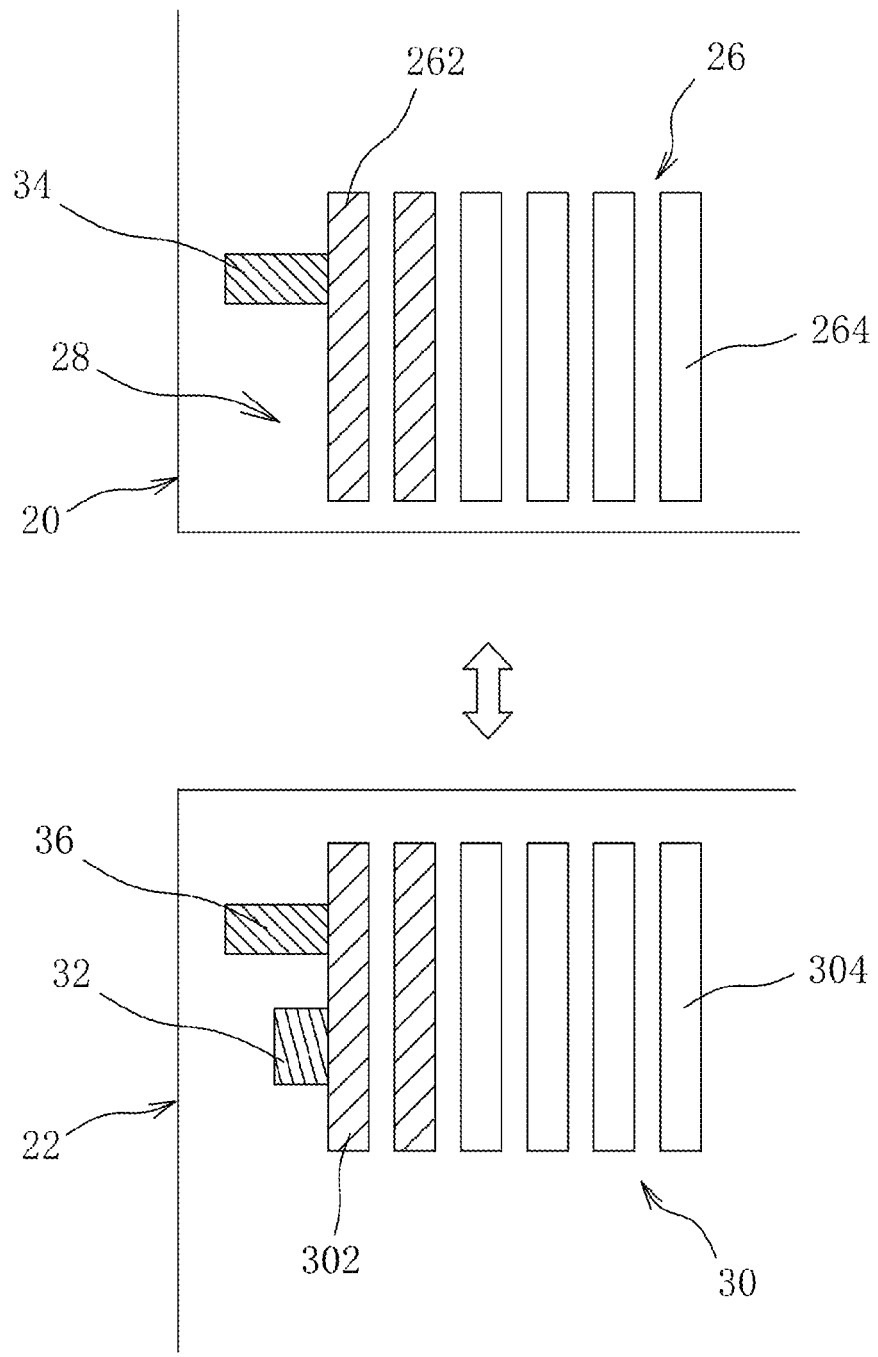
FIG. 2 is a diagram schematically illustrating a touch panel before assembly according to an embodiment of the present invention.

Refer to FIG. 2. FIG. 2 is a diagram schematically illustrating a touch panel before assembly according to an embodiment of the present invention. The touch panel comprises a touch sensing layer 20, a flexible circuit board 22, and an anisotropic conductive film 24. The touch sensing layer 20 comprises sensing pads 26 and a reserved room 28, and the reserved room 28 is arranged outside all the sensing pads 26. The sensing pads 26 further comprise at least one first grounding pad 262 and touch electrodes 264. The touch electrodes 264 may include touch sensing electrodes (Rx) and touch driving electrodes (Tx). The first grounding pad 262 is arranged outside all the touch electrodes 264. The first grounding pad 262 is arranged between the reserved room 28 and the touch electrode 264. That is to say, the reserved room 28 is arranged outside the first grounding pad 262. The touch sensing layer 20 comprises a transparent conductive material, such as indium tin oxide, indium zinc oxide, aluminum tin oxide, aluminum zinc oxide, indium germanium zinc oxide other suitable materials, or a stack layer of at least two of the aforesaid materials, but the present invention is not limited thereto. The first grounding pad 262 and the touch electrodes 264 are used as transparent conductive patterns.

The flexible circuit board 22 comprises conductive pads 30. The outermost conductive pad 30 is provided with a virtual pattern 32, and the position of the virtual pattern 32 corresponds to the position of the reserved room 28. The virtual pattern 32 may be connected to the outermost conductive pad 30. The flexible circuit board 22 is selected from a group consisting of polyether oxime (PES), polyethylene naphthalate (PEN), polyethylene (PE), polyimine (PI), polyvinyl chloride (PVC), and polyethylene terephthalate (PET) according to requirements, but the present invention is not limited thereto. The conductive pads 30 further comprise at least one second grounding pad 302 and touch pads 304. The touch pads 304 may include touch sensing pads (Rx) and touch driving pads (Tx). The second grounding pad 302 is arranged outside the touch pads 304. The second grounding pad 302 is arranged between the virtual pattern 32 and the touch pad 304. That is to say, the virtual pattern 32 is arranged outside the second grounding pad 302. The position of the first grounding pad 262 corresponds to the position of the second grounding pad 302. The positions of the touch electrodes 264 respectively correspond to the positions of the touch pads 304. The outermost sensing pad 26 of the touch sensing layer 20 is provided with a first aligned portion 34, the outermost conductive pad 30 of the flexible circuit board 22 is provided with a second aligned portion 36, and the first aligned portion 34 is correspondingly connected to the second aligned portion 36.

Figure 3:
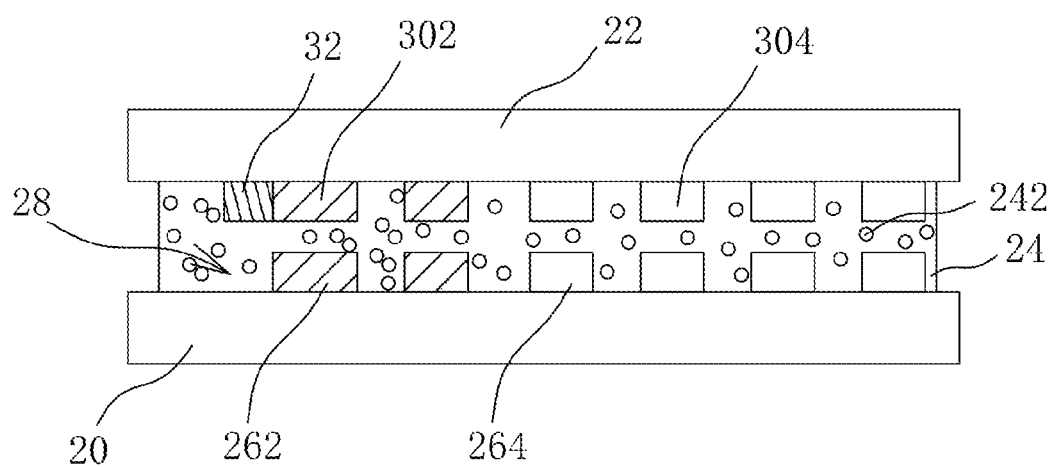
FIG. 3 is a diagram schematically illustrating a touch panel after assembly according to an embodiment of the present invention.

Refer to FIG. 2 and FIG. 3. FIG. 3 is a diagram schematically illustrating a touch panel after assembly according to an embodiment of the present invention. When the touch sensing layer 20 is combined with the flexible circuit board 22 through the anisotropic conductive film 24, the first aligned portion 34 is aligned and laminated to the second aligned portion 36. The anisotropic conductive film 24 comprises a plurality of conductive particles 242. The area of the virtual pattern 32 is larger than the area of one of the plurality of conductive particles 242. The area of the virtual pattern 32 is larger than 0.013 mm$^2$. Since the anisotropic conductive film 24 is arranged between the touch sensing layer 20 and the flexible circuit board 22, the first grounding pad 262 corresponds to the second grounding pad 302 to form an electrical connection, and the touch electrodes 264 correspond to the touch pads 304 to form an electrical connection. The area of the reserved room 28 is larger than the area of the virtual pattern 32, such that the rupture of conductive particles 242 of the anisotropic conductive film 24 is directly observed through the reserved room 28 when the anisotropic conductive film 24 is combined with the touch sensing layer 20 and the flexible circuit board 22. The anisotropic conductive film (ACF), having functions of unidirectional conduction and gluing, is mixed with a resin adhesive and conductive particles. When the ACF is pressured and heated, the conductive particles 242 are ruptured and extruded between the wiring portions to form a vertical (Z axis) electrical connection and a planar insulation (X and Y axes). The ACF has properties of thinning and simplifying processes and complies with the Restriction of Hazardous Substances Directive (RoHS). In addition, the resin adhesive has moisture-proof, gluing, heat-proof, and insulating functions, fixes the positions of electrodes of the touch sensing layer 20 and the flexible circuit board 22, and provides a force to maintain the area between the electrode and the conductive particle. The resin is divided into a thermoplastic resin and a thermosetting resin, but the present invention is not limited thereto. The thermoplastic resin has advantages of low-temperature bonding, easy reworking, and fast assembly and drawbacks of high thermal expansion and high hygroscopicity. The thermoplastic resin is easily deteriorated at high temperature. Thus, the thermoplastic resin does not have good reliability. The thermosetting resin may be epoxy or polyimide. The thermosetting resin has advantages of high-temperature stability, low thermal expansion and low hygroscopicity and drawbacks of high processing temperature and difficult reworking. Since the thermosetting resin has good reliability, the thermosetting resin is most popular.

The conductivity of the anisotropic conductive film 24 is quite related to the diameter of the conductive particle. The diameter of the conductive particle is smaller, the total conductive area of the conductive particle is larger and the current conductivity is better. According to experiment, the area of the virtual pattern 32 is preferably larger than 0.013 mm$^2$ Each signal pin corresponds to more than 10 conductive particles well pressured. As a result, the rupture of the conductive particles 242 is directly observed through the reserved room 28 when the anisotropic conductive film 24 is combined with the touch sensing layer 20 and the flexible circuit board 22.

Figure 4:
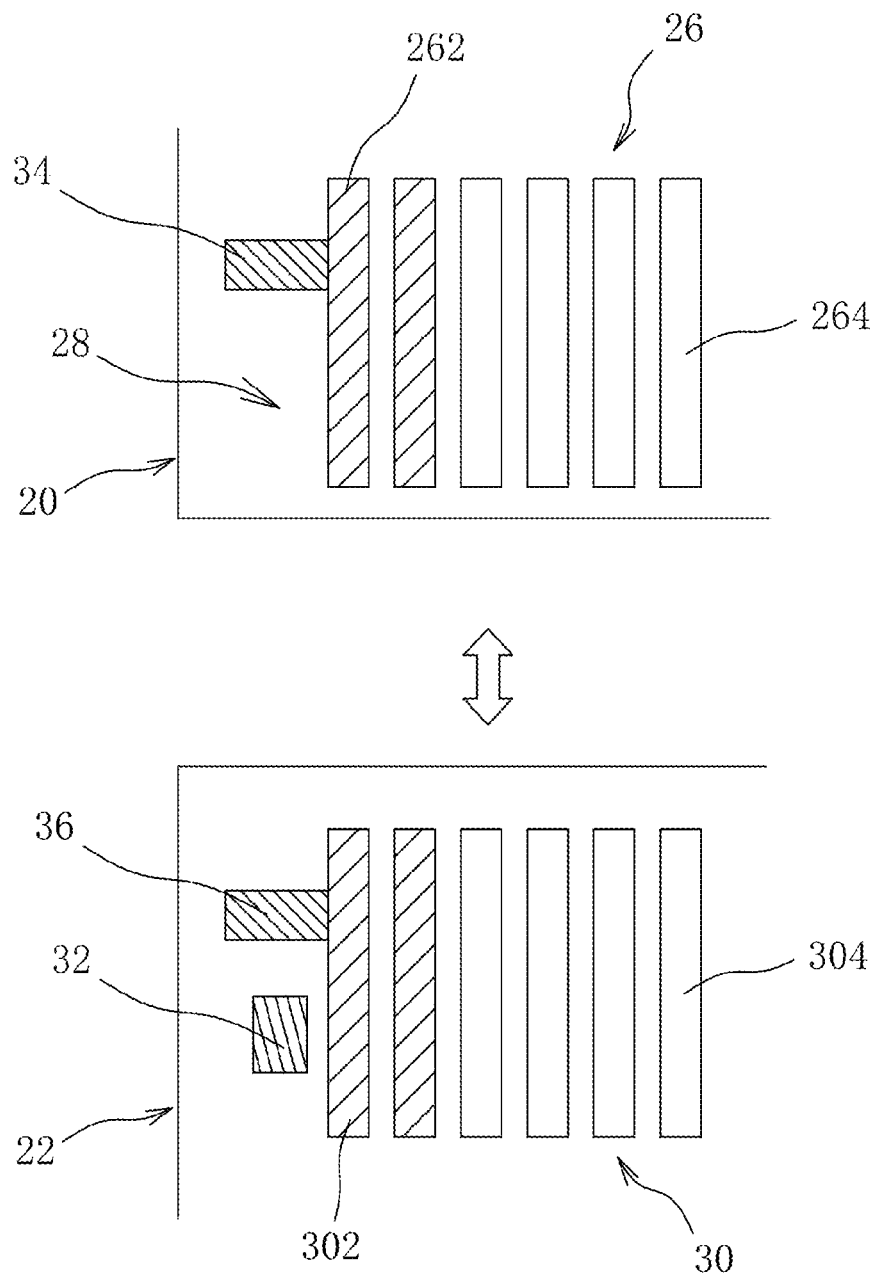
FIG. 4 is a diagram schematically illustrating a touch panel before assembly according to another embodiment of the present invention.
Figure 5:
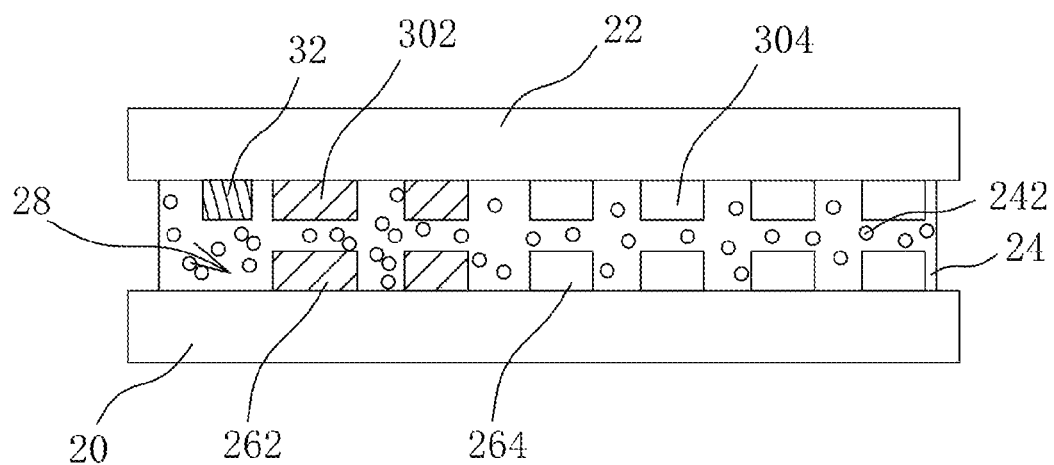
FIG. 5 is a diagram schematically illustrating a touch panel after assembly according to another embodiment of the present invention.

As mentioned above, the virtual pattern 32 is connected to the outermost conductive pad 30. Refer to FIG. 4. FIG. 4 is a diagram schematically illustrating a touch panel before assembly according to another embodiment of the present invention. The structure of the embodiment is the same to that of FIG. 2 and FIG. 3 so will not reiterated. The difference between the two embodiments is described as follows. There is a gap between the virtual pattern 32 and the outermost conductive pad 30. That is to say, the virtual pattern 32 is independent from the outermost conductive pad 30. The virtual pattern 32 may be electrically coupled to the outermost conductive pad 30, but the present invention is not limited thereto. Refer to FIG. 5. FIG. 5 is a diagram schematically illustrating a touch panel after assembly according to another embodiment of the present invention. The anisotropic conductive film 24 has a thickness of 45~55 μm. The area of the virtual pattern 32 is larger than the area of one of the conductive particles 242 of the anisotropic conductive film 24. On top of that, the area of the virtual pattern is larger than 0.013 mm$^2$. The area of the reserved room 28 of the touch sensing layer 20 is larger than the area of the virtual pattern 32. The anisotropic conductive film 24 is pressured and heated to rupture the conductive particles 242. Thus, the rupture of the conductive particles 242 of the anisotropic conductive film 24 is directly observed.

In conclusion, the present invention designs a virtual pattern outside all the conductive pads of a flexible circuit board without modifying the existing fabrication process, equipment, and materials. The touch sensing layer has a reserved room corresponding to the virtual pattern. The area of the reserved room is larger than the area of the virtual pattern. Thus, the present invention can reduce the area of the conventional virtual lead to simplify the wiring design, effectively reduce the area of the flexible circuit board and the fabrication cost, and have the market competitiveness.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A touch panel comprising:
   a touch sensing layer comprising sensing pads and a reserved room, and the reserved room is arranged outside the sensing pads;
   a flexible circuit board comprising conductive pads, an outermost the conductive pad is provided with a virtual pattern without functionality, and a position of the virtual pattern corresponds to a position of the reserved room; and
   an anisotropic conductive film arranged between the touch sensing layer and the flexible circuit board, and the sensing pads are respectively electrically connected to the conductive pads through the anisotropic conductive film;
   wherein the virtual pattern is arranged on an inner surface of the flexible circuit board and covered with the anisotropic conductive film.

2. The touch panel according to claim 1, wherein the virtual pattern is connected to the outermost the conductive pad.

3. The touch panel according to claim 1, wherein a gap exists between the virtual pad and the outermost the conductive pad.

4. The touch panel according to claim 1, wherein an outermost the sensing pad is provided with a first aligned portion, the outermost the conductive pad is provided with a second aligned portion, and the first aligned portion is correspondingly connected to the second aligned portion.

5. The touch panel according to claim 1, wherein the anisotropic conductive film comprises a plurality of conductive particles and an area of the virtual pattern is larger than an area of one of the plurality of conductive particles.

6. The touch panel according to claim 5, wherein the area of the virtual pattern is larger than 0.013 mm$^2$.

7. The touch panel according to claim 1, wherein the anisotropic conductive film has a thickness of 45~55 μm.

8. The touch panel according to claim 1, wherein an area of the reserved room is larger than an area of the virtual pattern.

9. The touch panel according to claim 1, wherein the sensing pads further comprise at least one first grounding pad and touch electrodes, the at least one first grounding pad is arranged outside the touch electrodes, and the at least one first grounding pad is arranged between the reserved room and the touch electrode.

10. The touch panel according to claim 1, wherein the conductive pads further comprise at least one second grounding pad and touch pads, the at least one second grounding pad is arranged outside the touch pads, and the at least one second grounding pad is arranged between the virtual pattern and the touch pad.

* * * * *